(12) United States Patent
Choi et al.

(10) Patent No.: US 11,081,388 B2
(45) Date of Patent: Aug. 3, 2021

(54) FORMING BARRIERLESS CONTACT

(71) Applicant: International Business Machines Corporation, Armonk, NY (US)

(72) Inventors: Kisik Choi, Watervliet, NY (US); Koichi Motoyama, Clifton Park, NY (US); Ashim Dutta, Menands, NY (US); Iqbal R. Saraf, Cobleskill, NY (US); Benjamin D. Briggs, Waterford, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 16/245,033

(22) Filed: Jan. 10, 2019

(65) Prior Publication Data

US 2020/0227313 A1  Jul. 16, 2020

(51) Int. Cl.
*H01L 21/768* (2006.01)
*H01L 23/535* (2006.01)
*H01L 21/02* (2006.01)

(52) U.S. Cl.
CPC .... *H01L 21/76834* (2013.01); *H01L 21/0228* (2013.01); *H01L 21/02183* (2013.01); *H01L 21/76877* (2013.01); *H01L 21/76883* (2013.01); *H01L 21/76897* (2013.01); *H01L 23/535* (2013.01)

(58) Field of Classification Search
CPC ......... H01L 23/53209; H01L 21/76834; H01L 21/535; H01L 21/02183; H01L 21/6897; H01L 21/76877; H01L 21/76883; H01L 21/0228; H01L 21/28562; H01L 21/76855; H01L 21/76831; H01L 21/76865; H01L 21/76856; H01L 21/76844; H01L 23/535; H01L 21/76897
See application file for complete search history.

(56) References Cited

U.S. PATENT DOCUMENTS

| 6,287,977 B1 | 9/2001 | Hashim et al. |
| 8,847,148 B2 | 9/2014 | Kirkpatrick et al. |
| 9,343,400 B2 | 5/2016 | Lee et al. |
| 9,449,874 B1 | 9/2016 | Standaert et al. |
| 9,741,609 B1 | 8/2017 | Cheng et al. |

(Continued)

OTHER PUBLICATIONS

M. Lapedus, "Next Challenge: Contact Resistance," Semiconductor Engineering (Jun. 2016) (7 pages).

(Continued)

*Primary Examiner* — Jasmine J Clark

(74) *Attorney, Agent, or Firm* — Abdy Raissinia; Michael J. Chang, LLC

(57) ABSTRACT

Techniques for forming barrierless contacts filled with Co are provided. In one aspect, a method for forming barrierless contacts includes: forming bottom metal contacts in a first ILD; depositing a second ILD on the bottom metal contacts; forming contact vias in the second ILD landing on the bottom metal contacts; selectively forming a liner on a top surface of the second ILD and on the second ILD along sidewalls of the contact vias; filling the contact vias with a metal; and removing an excess of the metal to form the barrierless contacts whereby metal-to-metal contact is present between the barrierless contacts and the bottom metal contacts. A contact structure is also provided.

18 Claims, 8 Drawing Sheets

(56) References Cited

U.S. PATENT DOCUMENTS

| | | | |
|---|---|---|---|
| 2004/0147104 A1 | 7/2004 | Lin et al. | |
| 2011/0272767 A1* | 11/2011 | Yin | H01L 21/76877 |
| | | | 257/412 |
| 2016/0163645 A1 | 6/2016 | Kamineni et al. | |
| 2018/0090418 A1 | 3/2018 | Bonilla et al. | |

OTHER PUBLICATIONS

Ohno et al., "Neutral beam oxidation for oxide-based nanodevice," 2016 IEEE 16th International Conference on Nanotechnology (IEEE-NANO) pp. 171-173 (Aug. 2016).
A. Agulyansky, "Potassium fluorotantalate in solid, dissolved and molten conditions," J. Fluorine Chemistry Oct. 2003, 155-161.
Usui et al., "Highly Reliable Copper Dual-Damascene Interconnects With Self-Formed MnSixOy Barrier Layer," IEEE Transactions on Electron Devices, vol. 53, No. 10, pp. 2492-2499 (Oct. 2006).
J. Koike et al., "Self-Formed Barrier with Cu—Mn alloy Metallization and its Effects on Reliability." AIP Conference Proceedings, vol. 817, No. 1, Feb. 2006, pp. 43-51. (Abstract).
C. Wu et al., "Cobalt CMP Development for 7nm Logic Device," ECS Transactions, vol. 77, No. 5, May 2017, pp. 93-97.

* cited by examiner

US 11,081,388 B2

FORMING BARRIERLESS CONTACT

FIELD OF THE INVENTION

The present invention relates to contact technology, and more particularly, to techniques for forming barrierless contacts filled with cobalt (Co).

BACKGROUND OF THE INVENTION

Standard complementary metal oxide semiconductor (CMOS) device fabrication typically involves the formation of contacts to the various device components. With transistors, for instance, contacts to the source and drain are usually formed by depositing a barrier layer/liner in a via over the source and drain, followed by a metal fill. Titanium nitride (TiN)/titanium Ti are popular barrier layer/liner materials with tungsten (W) as the fill metal.

With scaling, however, as the critical dimension (CD) of the contacts gets smaller, the volume of fill metal decreases and contact resistance undesirably increases. Other metals such as cobalt (Co) have been investigated as a replacement for tungsten (W). Co for instance, can be deposited using a vapor deposition process such as chemical vapor deposition (CVD) without needing a seed layer, thereby increasing the volume of bulk metal. Also, Co does not degrade the Ti liner, thereby enabling scaling of the TiN barrier layer. See, for example, M. Lapedus, "Next Challenge: Contact Resistance," Semiconductor Engineering (June 2016) (7 pages).

However, high contact resistance due to the highly resistive TiN barrier remains a major hurdle for scaling. Although the use of Co allows for the reduction of TiN barrier thickness as provided above, it is still not sufficient to meet the contact resistance requirements for future technology nodes.

Accordingly, techniques for reducing contact resistance would be desirable.

SUMMARY OF THE INVENTION

The present invention provides techniques for forming barrierless contacts filled with cobalt (Co). In one aspect of the invention, a method for forming barrierless contacts is provided. The method includes: forming bottom metal contacts in a first interlayer dielectric (ILD); depositing a second ILD on the bottom metal contacts; forming contact vias in the second ILD landing on the bottom metal contacts; selectively forming a liner on a top surface of the second ILD and on the second ILD along sidewalls of the contact vias; filling the contact vias with a metal (e.g., cobalt (Co)); and removing an excess of the metal to form the barrierless contacts whereby metal-to-metal contact is present between the barrierless contacts and the bottom metal contacts.

For example, the liner can include tantalum nitride (TaN) and the method can further include depositing the liner (e.g., by atomic layer deposition (ALD)) to a thickness of less than or equal to about 1 nm such that the liner forms selectively on the top surface of the second ILD and on the second ILD along sidewalls of the contact vias. Alternatively, the liner can include a first liner and a second liner, and the method can further include: conformally depositing the first liner onto the second ILD and lining the contact vias; selectively oxidizing horizontal portions of the first liner; removing the horizontal portions of the first liner that have been oxidized selective to unoxidized vertical portions of the first liner; conformally depositing a metal layer (e.g., manganese (Mn)) onto exposed surfaces of the second ILD and into the contact vias over the unoxidized vertical portions of the first liner; annealing the metal layer to react the metal layer with the second ILD to form a second liner on the top surface of the second ILD, wherein the second liner includes a metal oxide (e.g., MnSixOy); and removing unreacted portions of the metal layer selective to the second liner. Alternatively, the method can further include: conformally depositing a metal layer (e.g., Mn) onto exposed surfaces of the second ILD and into the contact vias; annealing the metal layer to react the metal layer with the second ILD to form the liner on the top surface of the second ILD and on the second ILD along sidewalls of the contact vias, wherein the liner includes a metal oxide (e.g., MnSixOy); and removing unreacted portions of the metal layer selective to the liner.

In another aspect of the invention, a contact structure is provided. The contact structure includes: bottom metal contacts formed in a first ILD; a second ILD disposed on the bottom metal contacts; contact vias present in the second ILD over the bottom metal contacts; a liner disposed selectively on the second ILD along sidewalls of the contact vias; and barrierless metal (e.g., Co) contacts formed in the contact vias whereby metal-to-metal contact is present between the barrierless metal contacts and the bottom metal contacts.

A more complete understanding of the present invention, as well as further features and advantages of the present invention, will be obtained by reference to the following detailed description and drawings.

DETAILED DESCRIPTION OF PREFERRED EMBODIMENTS

As described above, high contact resistance due to the highly resistive titanium nitride (TiN) barrier layer remains a major hurdle for contact scaling, even with metals such as cobalt (Co). Advantageously, provided herein are techniques for forming barrierless contacts filled with cobalt (Co). The contacts land on an underlying bottom metal contact such as a source and drain contact (preferably also formed from Co). By "barrierless" it is meant that there is no intervening barrier layer between the contact and the underlying bottom contact.

As will be described in detail below, the present techniques employ selective deposition of a very thin tantalum nitride (TaN) liner in the contact via and subsequently filling the via with Co. The very thin TaN liner deposits only on the dielectric material of the via sidewall but not on the bottom metal contact at the bottom of the via. Also, selective modification of manganese (Mn) liner above dielectric followed by subsequent removal of unmodified Mn can be used as an alternative.

Figure 1:
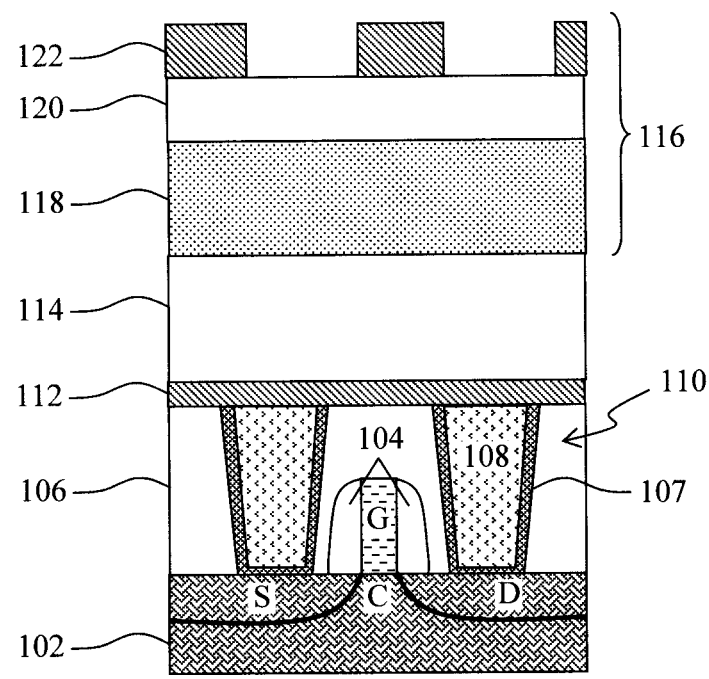
FIG. 1 is a cross-sectional diagram illustrating a field-effect transistor (FET) having been formed on a wafer, the FET having been buried in a first interlayer dielectric (ILD), bottom contacts having been formed in the first ILD, a capping layer having been deposited onto the first ILD/bottom contacts, a second ILD having been deposited onto the capping layer, a hardmask stack having been formed on the first ILD having a carbon layer, an oxide layer, and a nitride layer, and the nitride layer having been patterned with the footprint and location of one or more contact vias according to an embodiment of the present invention.

A first exemplary methodology for forming a contact structure having barrierless contacts in accordance with the present techniques is now described by way of reference to FIGS. 1-6. As shown in FIG. 1, the process begins with a wafer 102 having at least one semiconductor device formed thereon. By way of example only, wafer 102 can be a bulk semiconductor wafer, such as a bulk silicon (Si), germanium (Ge) or silicon germanium (SiGe) wafer, or a semiconductor-on-insulator (SOI) wafer. A SOI wafer generally includes a SOI layer (e.g., Si, Ge or SiGe) separated from a substrate by a buried insulator. When the buried insulator is an oxide it is also referred to herein as a buried oxide (BOX).

For illustrative purposes only, a single field-effect transistor (FET) is shown formed on wafer 102. The FET includes a source (S) and a drain (D) interconnected by a channel (C). A gate (G) regulates current flow through the channel. Spacers 104 are present on opposite sides of the gate, and serve to offset the gate from the source and drain. In this particular example, contacts will be formed to the source and drain of the FET.

Namely, as shown in FIG. 1, the FET is buried in a (first) interlayer dielectric (ILD) 106. Suitable ILDs include, but are not limited to, low-κ dielectric materials such as silicon oxide (SiOx) and/or ultra low-κ dielectric materials such as porous organosilicate glass (pSiCOH). By "ultra low-κ" it is meant that the material has a dielectric constant κ of less than 2.7. By comparison, silicon dioxide ($SiO_2$) has a dielectric constant κ value of 3.9. By way of example only, ILD 106 can be deposited onto the wafer 102 over the FET using a casting process such as spin coating, spray coating, etc. According to an exemplary embodiment, the ILD 106 has a thickness of from about 50 nanometers (nm) to about 150 nm and ranges therebetween.

Standard damascene processes are then employed to form bottom contacts 110 in the ILD 106. For instance, contact vias are first patterned in the ILD 106. The contact vias are then lined with a liner 107. Suitable materials for the liner 107 include, but are not limited to, titanium (Ti), tantalum (Ta), ruthenium (Ru), hafnium (Hf), titanium nitride (TiN) and/or tantalum nitride (TaN). In one exemplary embodiment, the liner 107 is a bi-layer barrier layer/liner, e.g., TiN/Ti. The liner 107 can be deposited using a conformal deposition process such as chemical vapor deposition (CVD), atomic layer deposition (ALD) or physical vapor deposition (PVD). According to an exemplary embodiment, the liner 107 has a thickness of from about 2 nm to about 10 nm and ranges therebetween.

A fill metal 108 is deposited onto the liner 107 filling the contact vias. Suitable fill metals include, but are not limited to, copper (Cu), tungsten (W) and/or cobalt (Co). According to an exemplary embodiment, the fill metal 108 is Co. As shown in FIG. 1, bottom contacts 110 are disposed on the source (S) and drain (D) of the FET.

A capping layer 112 is then deposited onto the ILD 106/bottom contacts 110. The capping layer 112 provides etch selectivity between the ILD 106 and a (second) ILD 114 in which the barrierless (top) contacts will be formed. Suitable materials for the capping layer 112 include, but are not limited to, nitride materials such as silicon nitride (SiN) and/or silicon oxycarbonitride (SiOCN) which can be deposited using a process such as CVD, ALD or PVD. According to an exemplary embodiment, the capping layer 112 has a thickness of from about 10 nm to about 20 nm and ranges therebetween.

A (second) ILD 114 is then deposited onto the capping layer 112. As provided above, suitable ILDs include, but are not limited to, low-κ dielectric materials such as SiOx and/or ultra low-κ dielectric materials such as pSiCOH. By way of example only, ILD 114 can be deposited onto the capping layer 112 using a casting process such as CVD, plasma-enhanced CVD (PECVD), spin coating, spray coating, etc. According to an exemplary embodiment, the ILD 114 has a thickness of from about 50 nm to about 150 nm and ranges therebetween.

A hardmask stack 116 is then formed on the ILD 114. In the non-limiting example depicted in FIG. 1, hardmask stack 116 is a tri-layer stack including a carbon layer 118 disposed on the ILD 114, an oxide layer 120 disposed on the carbon layer 118, and a nitride layer 122 disposed on the oxide layer 120.

Suitable carbon-based hardmask materials for carbon layer 118 are commercially-available, for example, from MicroChem Corp., Westborough, Mass. Carbon layer 118 can be deposited using a casting process such as spin coating, spray coating, etc. According to an exemplary embodiment, carbon layer 118 has a thickness of from about 40 nm to about 100 nm and ranges therebetween.

Suitable materials for oxide layer 120 include, but are not limited to, SiOx and/or silicon oxycarbide (SiOC) deposited using a process such as CVD, ALD or PVD. According to an exemplary embodiment, oxide layer 120 has a thickness of from about 20 nm to about 50 nm and ranges therebetween.

Suitable materials for the nitride layer 122 include, but are not limited to, SiN and/or SiOCN which can be deposited using a process such as CVD, ALD or PVD. According to an exemplary embodiment, nitride layer 122 has a thickness of from about 20 nm to about 50 nm and ranges therebetween.

Standard lithography and etching techniques are then used to pattern the nitride layer 122 with the footprint and location of one or more contact vias. See FIG. 1. A directional (i.e., anisotropic) etching process such as a (nitride-selective) reactive ion etching (RIE) can be used to pattern the nitride layer 122, with the underlying oxide layer 120 acting as an etch stop.

A directional (anisotropic) etching process such as RIE is used to transfer the pattern from the nitride layer 122 to the oxide layer 120/carbon layer 118. See FIG. 2. Following the etch, any remaining nitride layer 122 can be removed. The patterned oxide layer 120/carbon layer 118 is then used to form contact vias 302 in the ILD 114/capping layer 112. Oxide layer 120 can be removed simultaneously during contact vias 302 formation in ILD 114/capping layer 112. See FIG. 3. Following formation of the contact vias 302, any remaining carbon hardmask 118 can be removed using standard $O_2$ or $N_2/H_2$ based ash process. C4 F8 or C4 F6 based chemistry is used to etch ILD 114 and selectively stop on capping layer 112. $CH_3F$-based selective etch can be used to etch capping layer 112 which advantageously prevents any significant etching of the underlying ILD 106 during the patterning of the contact vias 302 in ILD 114.

Figure 3:
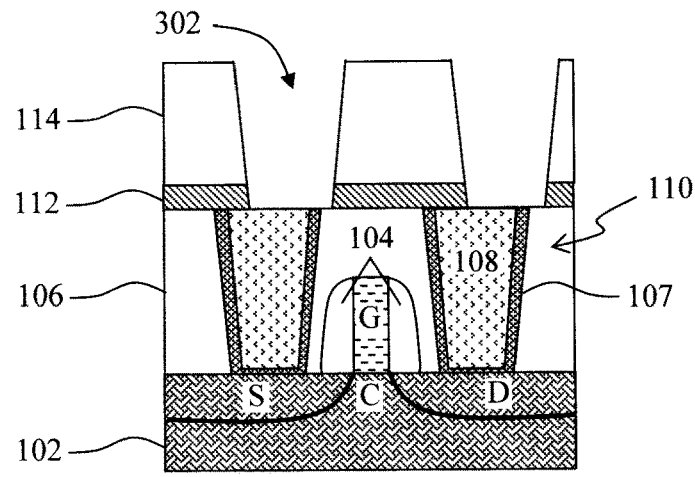
FIG. 3 is a cross-sectional diagram illustrating the patterned oxide layer/carbon layer having been used to form contact vias in the second ILD/capping layer according to an embodiment of the present invention.
Figure 4:
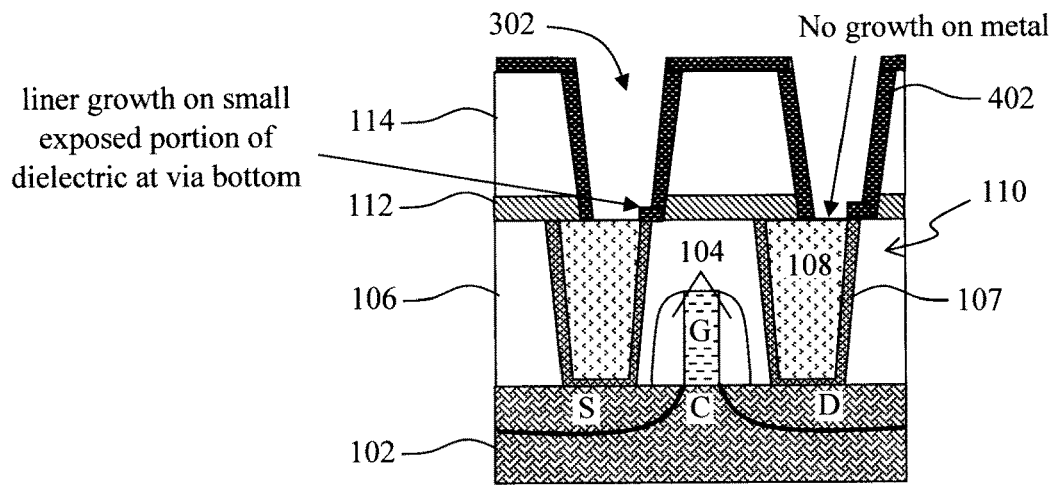
FIG. 4 is a cross-sectional diagram illustrating atomic layer deposition (ALD) having been used to grow a thin metal nitride liner selectively on the dielectric surfaces according to an embodiment of the present invention.

The goal is to have the contact vias 302 land squarely on the underlying bottom contacts 110. In practice however, as shown in FIG. 3, it is likely that there will be some misalignment between the contact vias 302 and the bottom contacts 110. As a result, a small portion of dielectric (i.e., ILD 106) is exposed at the bottom of the contact vias 302. However, based on the present process, these portions of exposed dielectric will be selectively lined while still permitting a direct metal-to-metal contact between the bottom contacts 110 and the barrierless (top) contacts.

In this first exemplary embodiment, ALD is used to grow a thin metal nitride liner 402 on the dielectric surfaces (including on the ILD 114/capping layer 112 along the inner sidewalls of the contact vias 302) selective to metal surfaces (such as the bottom contacts 110 which receive no growth, i.e., the liner 402 is absent from the bottom contacts 110). See FIG. 4. According to an exemplary embodiment, the metal nitride liner 402 is formed from tantalum nitride (TaN). Namely, it has been found herein that there is an incubation time for ALD TaN growth on metal. Thus, in the case of thin ALD TaN deposition (e.g., less than about 1 nm, e.g., from about 0.1 nm to about 1 nm and ranges therebetween), ALD TaN can grow only on top of dielectric surfaces. This selective growth concept is further discussed in conjunction with the description of FIG. 20, below.

It is notable that the selective growth of liner 402 will occur on any exposed dielectric surfaces including the top surface of the ILD 114 and small exposed portions (if any) of ILD 106 at the bottom of the contact vias 302. See FIG. 4.

Figure 5:
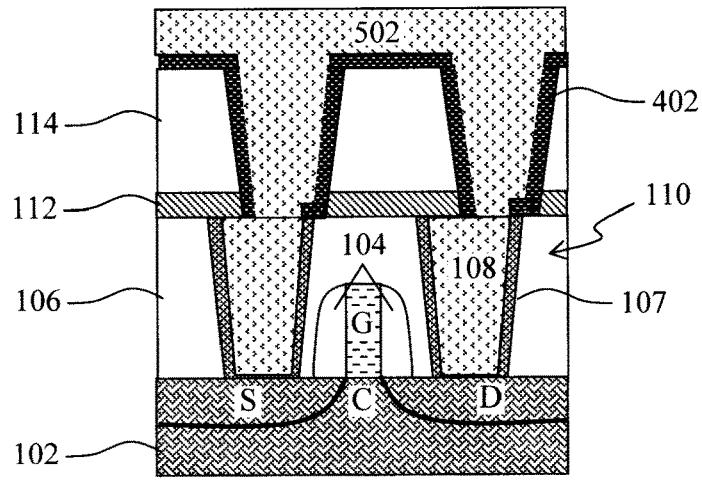
FIG. 5 is a cross-sectional diagram illustrating a metal having been deposited into and filling the contact vias according to an embodiment of the present invention.

A metal 502 is then deposited into and filling the contact vias 302. See FIG. 5. According to an exemplary embodiment, the metal 502 is cobalt (Co). Metal 502 can be deposited using a process such as sputtering, evaporation, electrochemical plating, etc. As shown in FIG. 5, the metal 502 is in direct contact with the metal 108 (e.g., also Co) of the bottom contact 110, i.e., there is metal-to-metal contact between 502 and 108. This is due to the absence of the liner 402 at the bottoms of the contact vias 302. This is what is referred to herein as a barrierless contact.

Figure 6:
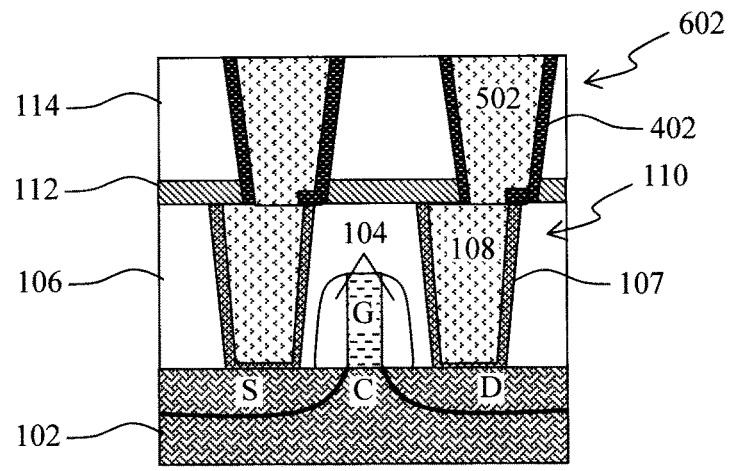
FIG. 6 is a cross-sectional diagram illustrating excess metal having been removed, forming barrierless contacts having a liner only along the dielectric sidewalls of the contacts and absent from the bottom of the contacts according to an embodiment of the present invention.

Finally, as shown in FIG. 6, excess metal 502 is removed, e.g., using a process such as chemical mechanical polishing (CMP). The result is the formation of barrierless (top) contacts 602 having a liner 402 only along the dielectric sidewalls of the contacts 602 and absent from the bottom of the contacts 602.

In another exemplary embodiment of the present techniques, a contact structure having barrierless (top) contacts is formed using selective oxidation and removal of select portions of the liner such that the liner remains along only the dielectric sidewalls of the contacts and is absent from the bottom of the contacts. This exemplary embodiment is now described by way of reference to FIGS. 7-14.

Figure 2:
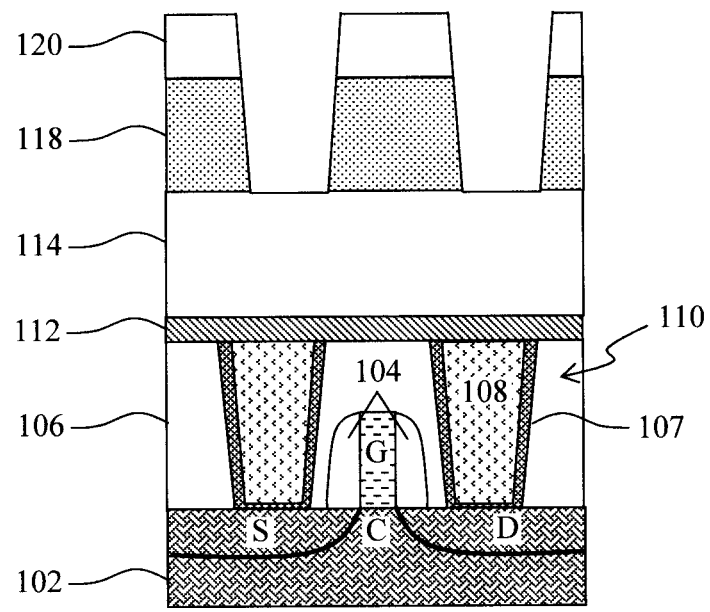
FIG. 2 is a cross-sectional diagram illustrating the pattern having been transferred from the nitride layer to the oxide layer/carbon layer according to an embodiment of the present invention.

The initial steps of the process are the same as those described in conjunction with the description of FIGS. 1-3, above. Thus, FIG. 7 follows from the structure shown in FIG. 3. Accordingly, like structures are numbered alike in the figures.

Figure 7:
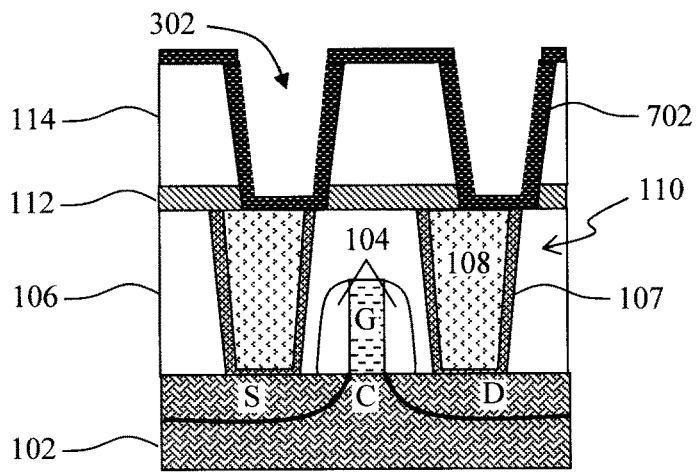
FIG. 7 is a cross-sectional diagram which follows from FIG. 3 illustrating, according to an alternative embodiment, a first conformal liner having been deposited onto the second ILD and lining the contact vias according to an embodiment of the present invention.
Figure 8:
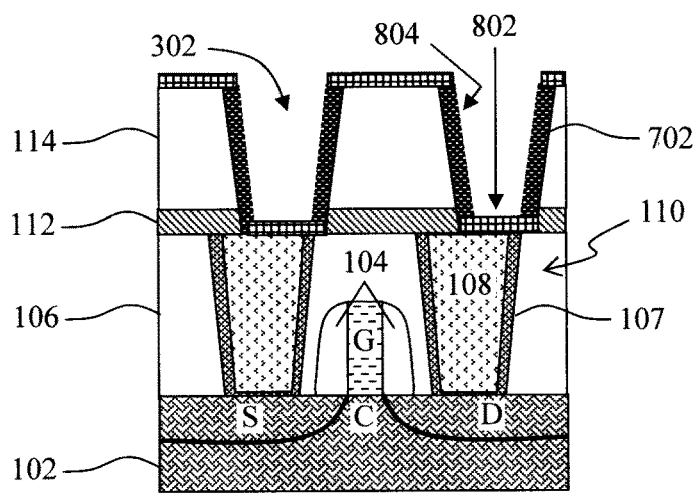
FIG. 8 is a cross-sectional diagram illustrating a directional oxidation process having been used to oxidize horizontal portions of the first liner according to an embodiment of the present invention.

As shown in FIG. 7, a conformal liner 702 is deposited onto the ILD 114 and lining the contact vias 302. Suitable materials for the liner 702 include, but are not limited to, metal nitrides such as TiN and/or TaN. The liner 702 can be deposited using a process such as CVD, ALD or PVD. According to an exemplary embodiment, liner 702 has a thickness of from about 2 nm to about 5 nm and ranges therebetween. In this case, the liner 702 will grow on both dielectric and metal surfaces, including on the metal 108 of the bottom contacts 110. See FIG. 7.

A directional oxidation process such as neutral beam oxidation, is then used to oxidize horizontal portions 802 (selective to vertical portions 804) of the liner 702, including the horizontal portions 802 of the liner 702 on the bottom contacts 110. See FIG. 8. For a description of neutral beam oxidation of metal films such as Ta-containing films see, for example, U.S. Pat. No. 8,847,148 issued to Kirpatrick et al., entitled "Method and Apparatus for Neutral Beam Processing Based on Gas Cluster Ion Beam Technology," and Ohno et al., "Neutral beam oxidation for oxide-based nanodevice," 2016 IEEE 16$^{th}$ International Conference on Nanotechnology (IEEE-NANO) (August 2016), the contents of both of which are incorporated by reference as if fully set forth herein. During this process, the barrier layer is irradiated with a neutral oxygen beam to convert the barrier layer to a metal oxide, which can then be selectively removed. Advantageously, neutral beam oxidation is a highly selective, directional oxidation process allowing for the selective oxidation of only the horizontal portions of the liner 702.

Figure 9:
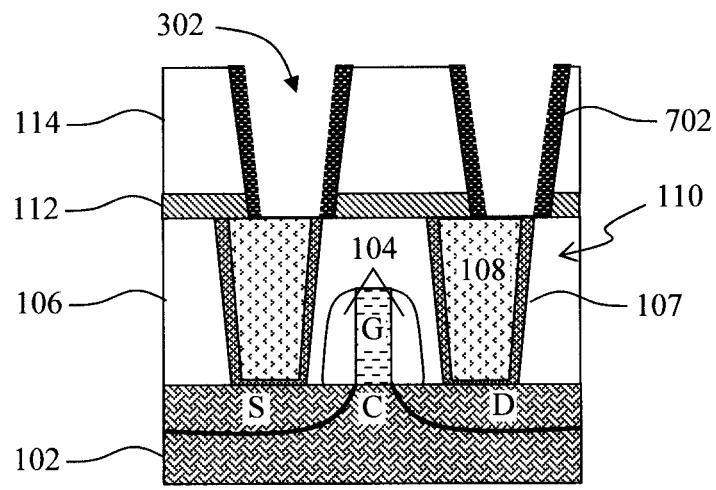
FIG. 9 is a cross-sectional diagram illustrating the oxidized horizontal portions of the first liner having been removed selective to the unoxidized vertical portions of liner according to an embodiment of the present invention.

The oxidized horizontal portions 802 of liner 702 are then removed selective to the unoxidized vertical portions 804 of liner 702. See FIG. 9. According to an exemplary embodiment, the oxidized horizontal portions 802 of liner 702 are selectively removed using an isotropic wet etching process. By way of example only, TaOxNy dissolves in hydrofluoric acid (HF), and reacts with potassium bifluoride and HF. See, for example, A. Agulyansky, "Potassium fluorotantalate in solid, dissolved and molten conditions," J. Fluorine Chemistry 2003, 155-161, the contents of which are incorporated by reference as if fully set forth herein. For TiN, dilute HF can be used to selectively remove oxidized TiN selective to TiN. As shown in FIG. 9, liner 702 is now only present along the inner vertical dielectric (i.e., ILD 114/capping layer 112) surfaces of the contact vias 302.

There is, however, exposed dielectric at the top surface of the ILD 114 and potentially small exposed portions of ILD 106 at the bottom of the contact vias 302. See FIG. 9. A second liner (wherein liner 702 is the first liner) is then formed selectively on these exposed portions of dielectric. According to an exemplary embodiment, the second liner is formed from a metal (such as manganese (Mn)) and an anneal is performed to selectively react the liner metal with the underlying dielectric, forming a metal oxide. The unreacted metal liner, i.e., those portions of the second liner present on top of liner 702 and on top of the metal 108 of bottom contacts 110 can then be selectively removed, leaving behind the metal oxide liner.

Figure 10:
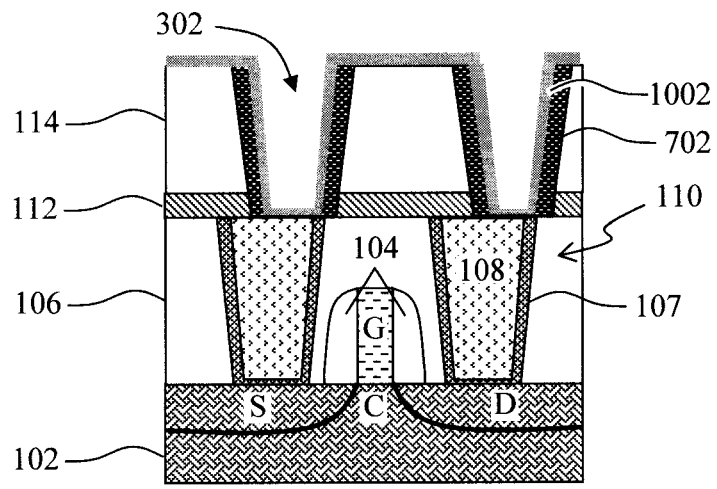
FIG. 10 is a cross-sectional diagram illustrating a metal layer (e.g., Mn) having been deposited conformally into the contact vias over the liner and top surface of the second ILD according to an embodiment of the present invention.

Namely, a metal layer 1002 is deposited conformally into the contact vias 302 over the liner 702 and top surface of the ILD 114. See FIG. 10. As shown in FIG. 10, metal layer 1002 is deposited onto the metal 108 of bottom contacts 110. However, this portion of the metal layer 1002 will remain unreacted and is later removed to provide a barrierless contact. A process such as CVD, ALD or PVD can be used to deposit the metal layer 1002. According to an exemplary embodiment, the metal layer 1002 is formed from manganese (Mn) and has a thickness of from about 5 nm to about 20 nm and ranges therebetween.

Figure 11:
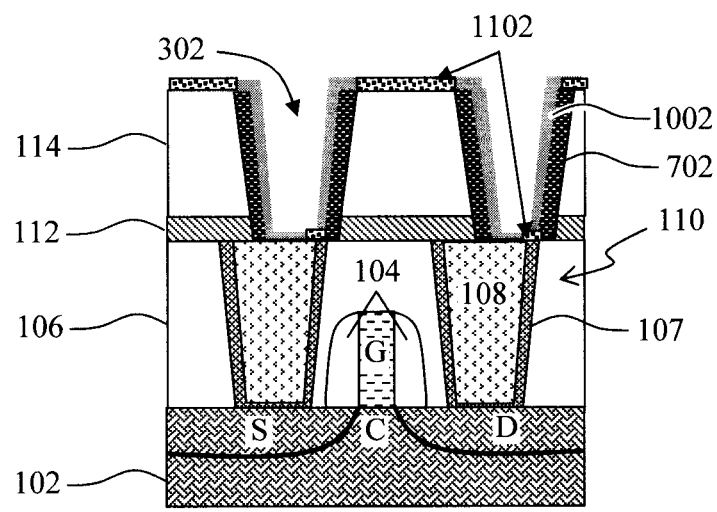
FIG. 11 is a cross-sectional diagram illustrating an anneal of the metal layer having been performed to react the metal layer with the exposed second ILD (and any exposed first ILD at the bottoms of the contact vias) to form a second liner (e.g., MnSixOy) along these dielectric surfaces according to an embodiment of the present invention.

An anneal of the metal layer 1002 is then performed to react the metal layer 1002 with the exposed ILD 114 (and any exposed ILD 106 at the bottoms of the contact vias 302) to form a second (metal oxide) liner 1102 along these dielectric surfaces. Everywhere else (including where the metal layer 1002 is present on liner 702 and on metal 108 of bottom contacts 110) the metal layer 1002 remains unreacted. See FIG. 11. As shown in FIG. 11, if there is exposed ILD 106 at the bottom of the contact vias 302, liner 1102 will form on those surfaces.

As provided above, the metal layer 1002 can be formed from Mn. In that case, portions of the metal layer 1002 in contact with the exposed ILD 114/ILD 106 will selectively be converted to MnSixOy (i.e., liner 1102 is MnSixOy), while everywhere else (including where metal layer 1002 is present on liner 702 and on metal 108 of bottom contacts 110) the metal layer 1002 remains unreacted Mn. The silicon (Si) and oxygen (O) for the reaction come from the exposed ILD 114/ILD 106. See, for example, Usui et al., "Highly Reliable Copper Dual-Damascene Interconnects With Self-Formed MnSi$_x$O$_y$ Barrier Layer," IEEE Transactions on Electron Devices, vol. 53, no. 10, pps. 2492-2499 (October 2006), the contents of which are incorporated by reference as if fully set forth herein. According to an exemplary embodiment, the anneal is performed at a temperature of from about 100 degrees Celsius (° C.) to about 400° C. and ranges therebetween, for a duration of from about 30 minutes (min) to about 120 min and ranges therebetween.

Figure 12:
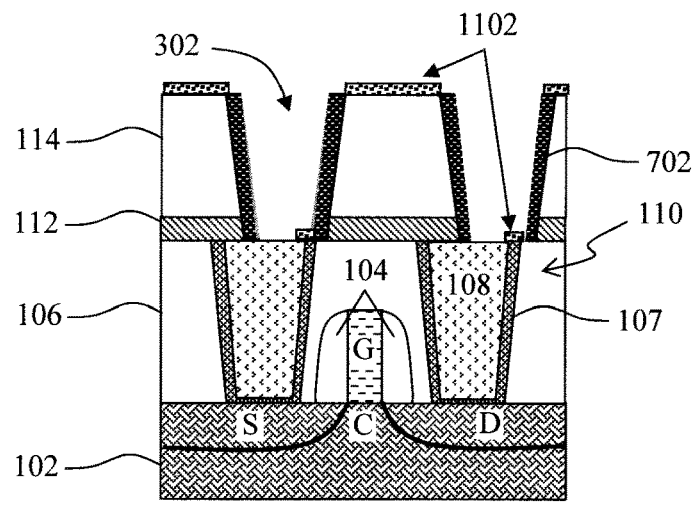
FIG. 12 is a cross-sectional diagram illustrating the remaining metal layer that is unreacted having been selectively removed according to an embodiment of the present invention.

The remaining metal layer 1002 that is unreacted is then removed selective to the (reacted metal oxide) liner 1102. See FIG. 12. As shown in FIG. 12, what remains is the liner 1102 (e.g., MnSixOy) disposed on the top surface of the ILD 114 and on any exposed ILD 106 at the bottoms of the contact vias 302. According to an exemplary embodiment, the metal layer 1002 that is unreacted is selectively removed using deionized (DI) water.

Figure 13:
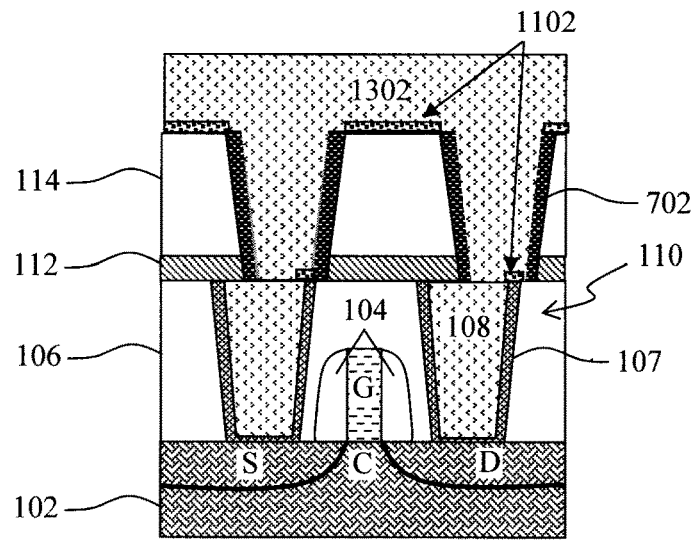
FIG. 13 is a cross-sectional diagram illustrating a metal having been deposited into and filling the contact vias according to an embodiment of the present invention.

A metal 1302 is then deposited into and filling the contact vias 302. See FIG. 13. According to an exemplary embodiment, the metal 1302 is Co. Metal 1302 can be deposited using a process such as sputtering, evaporation, electrochemical plating, etc. As shown in FIG. 13, the metal 1302 is in direct contact with the metal 108 (e.g., also Co) of the bottom contact 110, i.e., there is metal-to-metal contact between 1302 and 108. This is due to the absence of the liner 702 at the bottoms of the contact vias 302. This is what is referred to herein as a barrierless contact.

Figure 14:
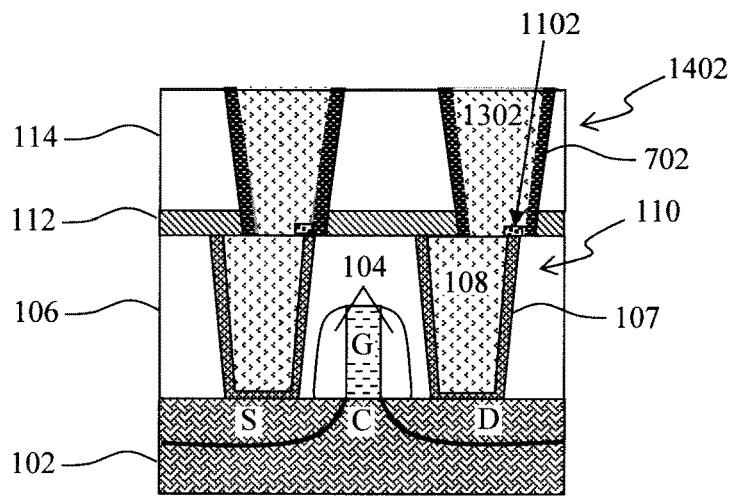
FIG. 14 is a cross-sectional diagram illustrating excess metal having been removed, forming barrierless contacts having a liner only along the dielectric sidewalls of the contacts and absent from the bottom of the contacts according to an embodiment of the present invention.

Finally, as shown in FIG. 14, excess metal 1302 is removed, e.g., using a process such as CMP. The result is the formation of barrierless (top) contacts 1402 having (dual) first/second liners 702 and 1102 along only the dielectric surfaces (i.e., along ILD 114 and any portions of the ILD 106 at the bottoms of the contact vias) and absent from the bottom of the contacts 1402.

In yet another exemplary embodiment of the present techniques, the selective reaction of a metal layer with the underlying dielectric and removal of the unreacted metal (as in the preceding example) is employed to form a contact structure having barrierless (top) contacts whereby the reacted (metal oxide) liner remains along only the dielectric sidewalls of the contacts and is absent from the bottom of the contacts. This exemplary embodiment is now described by way of reference to FIGS. 15-19.

The initial steps of the process are the same as those described in conjunction with the description of FIGS. 1-3, above. Thus, FIG. 15 follows from the structure shown in FIG. 3. Accordingly, like structures are numbered alike in the figures.

Figure 15:
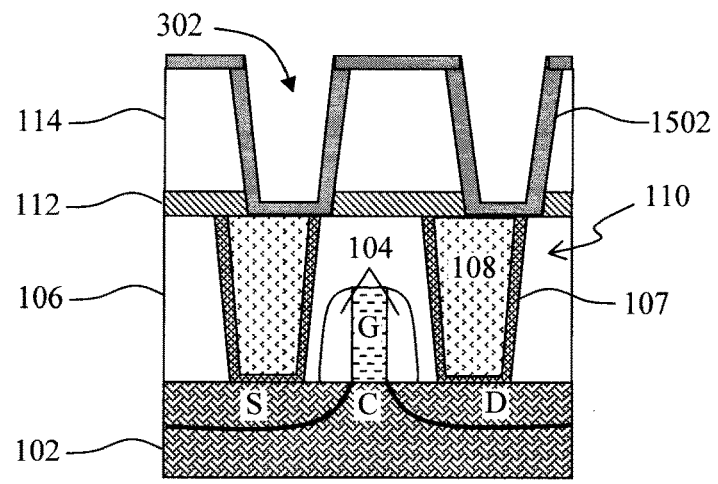
FIG. 15 is a cross-sectional diagram which follows from FIG. 3 illustrating, according to another alternative embodiment, a conformal metal layer (e.g., Mn) having been deposited onto the second ILD and lining the contact vias according to an embodiment of the present invention.

As shown in FIG. 15, a conformal metal layer 1502 is deposited onto the ILD 114 and lining the contact vias 302. As shown in FIG. 15, metal layer 1502 is deposited onto the metal 108 of bottom contacts 110. However, this portion of the metal layer 1502 will remain unreacted and is later removed to provide a barrierless contact. A process such as CVD, ALD or PVD can be used to deposit the metal layer 1502. According to an exemplary embodiment, the metal layer 1502 is formed from Mn and has a thickness of from about 5 nm to about 20 nm and ranges therebetween.

Figure 16:
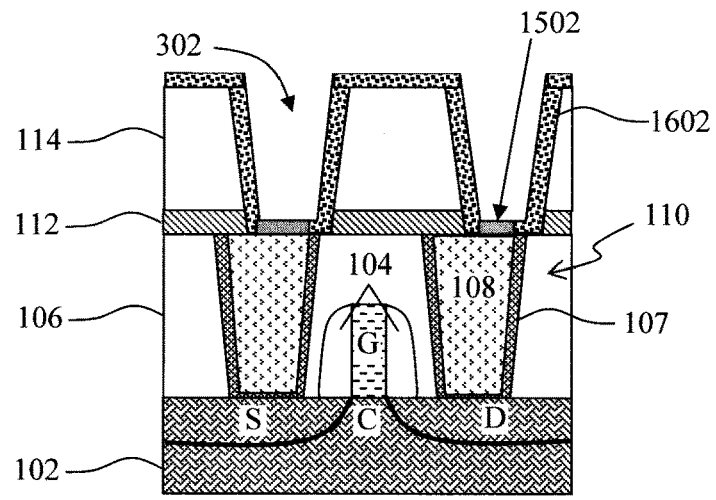
FIG. 16 is a cross-sectional diagram illustrating an anneal of the metal layer having been performed to react the metal layer with the exposed second ILD (and any exposed first ILD at the bottoms of the contact vias) to form a liner (e.g., MnSixOy) along these dielectric surfaces according to an embodiment of the present invention.

An anneal of the metal layer 1502 is then performed to react the metal layer 1502 with the exposed ILD 114 (and any exposed ILD 106 at the bottoms of the contact vias 302) to form a (metal oxide) liner 1602 along these dielectric surfaces. See FIG. 16. As shown in FIG. 16, the metal layer 1502 remains unreacted where the metal layer 1502 is present on metal 108 of bottom contacts 110. As also shown in FIG. 16, if there is exposed ILD 106 at the bottom of the contact vias 302, liner 1602 will form on those surfaces.

As provided above, the metal layer 1502 can be formed from Mn. In that case, portions of the metal layer 1502 in contact with the exposed ILD 114/ILD 106 will selectively be converted to MnSixOy (i.e., liner 1602 is MnSixOy), while the metal layer 1502 remains unreacted Mn where metal layer 1502 is present on metal 108 of bottom contacts 110. According to an exemplary embodiment, the anneal is performed at a temperature of from about 100° C. to about 400° C. and ranges therebetween, for a duration of from about 30 minutes (min) to about 120 min and ranges therebetween.

Figure 17:
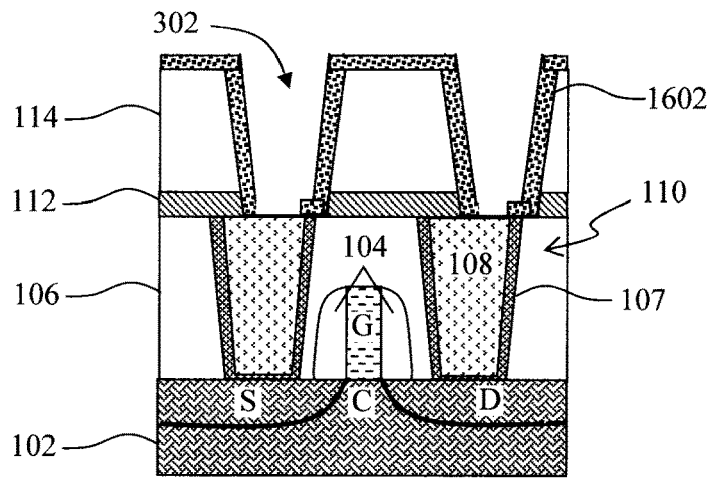
FIG. 17 is a cross-sectional diagram illustrating the remaining metal layer that is unreacted having been selectively removed according to an embodiment of the present invention.

The remaining metal layer 1502 that is unreacted is then removed selective to the (reacted metal oxide) liner 1602. See FIG. 17. As shown in FIG. 17, what remains is the liner 1602 (e.g., MnSixOy) disposed on the top surface of the ILD 114 and on the ILD 114 along the sidewalls of the contact vias 302, and on any exposed ILD 106 at the bottoms of the contact vias 302. According to an exemplary embodiment, the metal layer 1502 that is unreacted is selectively removed using DI water.

Figure 18:
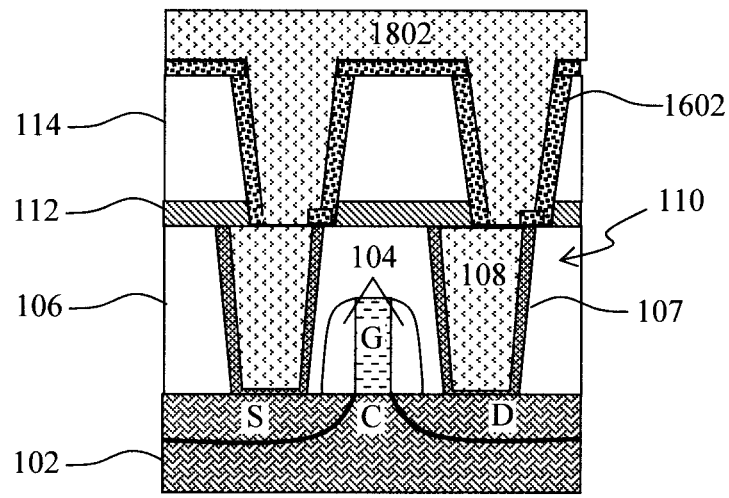
FIG. 18 is a cross-sectional diagram illustrating a metal having been deposited into and filling the contact vias according to an embodiment of the present invention.

A metal 1802 is then deposited into and filling the contact vias 302. See FIG. 18. According to an exemplary embodiment, the metal 1802 is Co. Metal 1802 can be deposited using a process such as sputtering, evaporation, electrochemical plating, etc. As shown in FIG. 18, the metal 1802 is in direct contact with the metal 108 (e.g., also Co) of the bottom contact 110, i.e., there is metal-to-metal contact between 1802 and 108. This is due to the absence of the liner 1602 at the bottoms of the contact vias 302. This is what is referred to herein as a barrierless contact.

Figure 19:
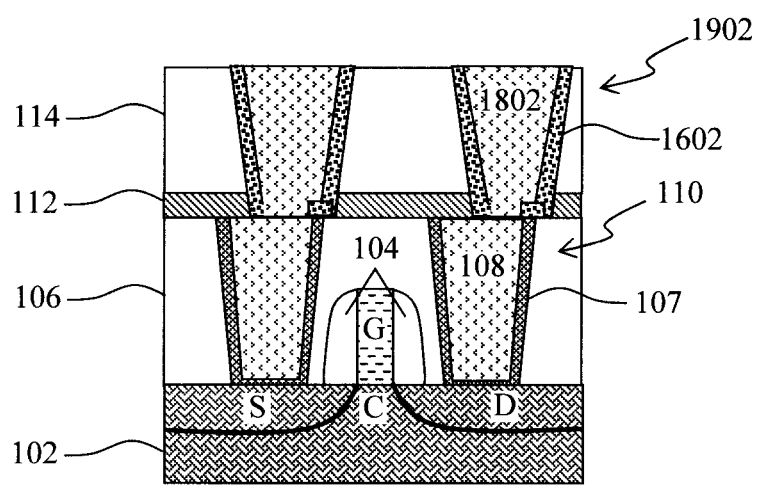
FIG. 19 is a cross-sectional diagram illustrating excess metal having been removed, forming barrierless contacts having a liner only along the dielectric sidewalls of the contacts and absent from the bottom of the contacts according to an embodiment of the present invention.

Finally, as shown in FIG. 19, excess metal 1802 is removed, e.g., using a process such as CMP. The result is the formation of barrierless (top) contacts 1902 having liner 1602 along only the dielectric surfaces (i.e., along ILD 114 and any portions of the ILD 106 at the bottoms of the contact vias 302) and absent from the bottom of the contacts 1902.

Figure 20:
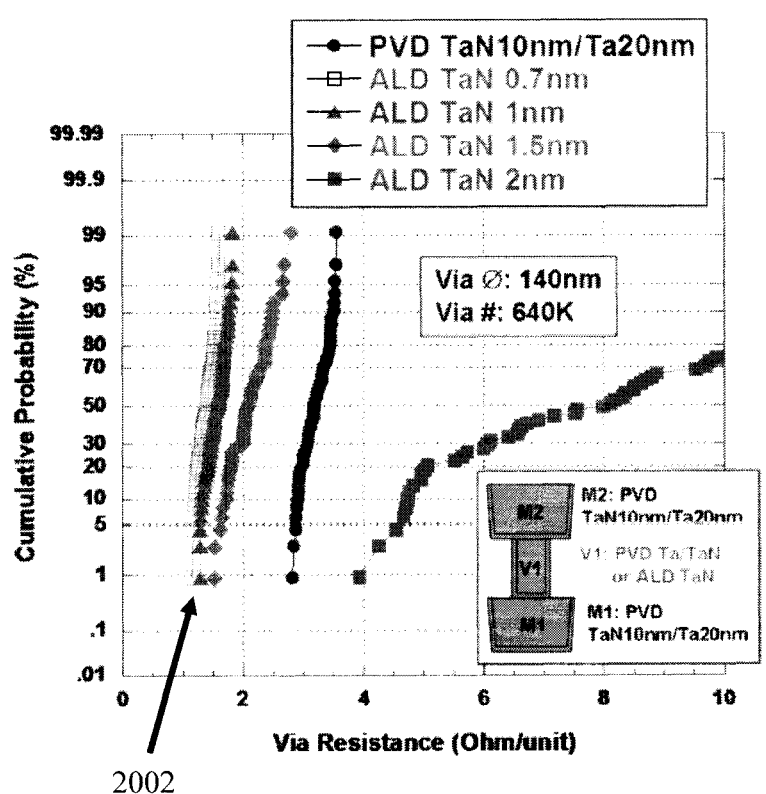
FIG. 20 is a diagram illustrating how ALD TaN, if kept thin, will grow selectively on dielectric as opposed to metal surfaces according to an embodiment of the present invention.

As provided above, if kept thin enough (e.g., less than about 1 nm, e.g., from about 0.1 nm to about 1 nm and ranges therebetween) ALD TaN will grow selectively on dielectric as opposed to metal surfaces. This concept is demonstrated in the example provided in FIG. 20. Referring to FIG. 20, in this example copper (Cu) vias V1 were formed between two metal lines M1 and M2. The vias V1 were lined with either PVD Ta/TaN or ALD TaN of varying thicknesses. For the samples 2002 (i.e., ALD TaN 0.7 nm, ALD TaN 1 nm, ALD TaN 1.5 nm) it was confirmed that there was metal-to-metal (i.e., Cu-to-Cu) direct connection as the Via V1 bottom (no TaN at via V1 bottom) by via V1 resistance in the case of 1 nm thick ALD TaN or less.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming barrierless contacts, the method comprising the steps of:
   forming bottom metal contacts in a first interlayer dielectric (ILD);
   depositing a second ILD on the bottom metal contacts;
   forming contact vias in the second ILD landing on the bottom metal contacts;
   selectively forming a liner on a top surface of the second ILD and on the second ILD along sidewalls of the contact vias leaving exposed at least a portion of a top surface of the bottom metal contacts;
   filling the contact vias with a metal; and
   removing an excess of the metal to form the barrierless contacts whereby metal-to-metal contact is present between the barrierless contacts and the bottom metal contacts.

2. The method of claim 1, wherein the metal comprises cobalt (Co).

3. The method of claim 1, wherein portions of the first ILD are exposed at bottoms of the contact vias, and wherein the liner is also selectively formed on the portions of the first ILD exposed at the bottoms of the contact vias.

4. The method of claim 1, wherein the liner comprises a metal nitride.

5. The method of claim 4, wherein the liner comprises tantalum nitride (TaN), and wherein the method further comprises the step of:
   depositing the liner to a thickness of less than or equal to about 1 nm such that the liner forms selectively on the top surface of the second ILD and on the second ILD along sidewalls of the contact vias.

6. The method of claim 5, wherein the liner is deposited using atomic layer deposition (ALD).

7. The method of claim 1, wherein the liner comprises a first liner and a second liner, and wherein the method further comprises the steps of:
   conformally depositing the first liner onto the second ILD and lining the contact vias;
   selectively oxidizing horizontal portions of the first liner;
   removing the horizontal portions of the first liner that have been oxidized selective to unoxidized vertical portions of the first liner;
   conformally depositing a metal layer onto exposed surfaces of the second ILD and into the contact vias over the unoxidized vertical portions of the first liner;
   annealing the metal layer to react the metal layer with the second ILD to form a second liner on the top surface of the second ILD, wherein the second liner comprises a metal oxide; and
   removing unreacted portions of the metal layer selective to the second liner.

8. The method of claim 7, wherein the first liner comprises a metal nitride selected from the group consisting of: TaN, titanium nitride (TiN), and combinations thereof.

9. The method of claim 7, wherein the metal layer comprises manganese (Mn), and wherein the metal oxide comprises MnSixOy.

10. The method of claim 7, wherein the horizontal portions of the first liner are selectively oxidized using neutral beam oxidation.

11. The method of claim 7, wherein the annealing is performed at a temperature of from about 100° C. to about 400° C. and ranges therebetween, for a duration of from about 30 minutes to about 120 minutes and ranges therebetween.

12. The method of claim 7, wherein the unreacted portions of the metal layer are removed selective to the second liner using deionized (DI) water.

13. The method of claim 7, wherein portions of the first ILD are exposed at bottoms of the contact vias, and wherein via the annealing step the metal layer reacts with the portions of the first ILD exposed at the bottoms of the contact vias to form the second liner on the portions of the first ILD exposed at bottoms of the contact vias.

14. The method of claim 1, further comprising the steps of:
   conformally depositing a metal layer onto exposed surfaces of the second ILD and into the contact vias;
   annealing the metal layer to react the metal layer with the second ILD to form the liner on the top surface of the second ILD and on the second ILD along sidewalls of the contact vias, wherein the liner comprises a metal oxide; and
   removing unreacted portions of the metal layer selective to the liner.

15. The method of claim 14, wherein the metal layer comprises Mn, and wherein the metal oxide comprises MnSixOy.

16. The method of claim 14, wherein the annealing is performed at a temperature of from about 100° C. to about 400° C. and ranges therebetween, for a duration of from about 30 minutes to about 120 minutes and ranges therebetween.

17. The method of claim 14, wherein the unreacted portions of the metal layer are removed selective to the liner using DI water.

18. The method of claim 14, wherein portions of the first ILD are exposed at bottoms of the contact vias, and wherein via the annealing step the metal layer reacts with the portions of the first ILD exposed at the bottoms of the contact vias to form the liner on the portions of the first ILD exposed at bottoms of the contact vias.

* * * * *